(12) United States Patent
Zhang et al.

(10) Patent No.: US 10,985,050 B2
(45) Date of Patent: Apr. 20, 2021

(54) SEMICONDUCTOR CHIP, SEMICONDUCTOR WAFER AND METHOD FOR MANUFACTURING SEMICONDUCTOR WAFER

(71) Applicant: Dynax Semiconductor, Inc., Kunshan (CN)

(72) Inventors: Naiqian Zhang, Kunshan (CN); Pan Pan, Kunshan (CN)

(73) Assignee: Dynax Semiconductor, Inc., Kunshan (CN)

( * ) Notice: Subject to any disclaimer, the term of this patent is extended or adjusted under 35 U.S.C. 154(b) by 0 days.

(21) Appl. No.: 15/669,780

(22) Filed: Aug. 4, 2017

(65) Prior Publication Data
US 2018/0182663 A1     Jun. 28, 2018

Related U.S. Application Data

(63) Continuation of application No. PCT/CN2017/084120, filed on May 12, 2017.

(30) Foreign Application Priority Data

Dec. 23, 2016   (CN) .......................... 201611209475.7

(51) Int. Cl.
*H01L 29/40*     (2006.01)
*H01L 21/762*    (2006.01)
(Continued)

(52) U.S. Cl.
CPC .... *H01L 21/76259* (2013.01); *H01L 21/2022* (2013.01); *H01L 21/3081* (2013.01);
(Continued)

(58) Field of Classification Search
CPC ............... H01L 21/76259; H01L 22/10; H01L 21/2022; H01L 21/76898; H01L 21/76877;
(Continued)

(56) References Cited

U.S. PATENT DOCUMENTS 5,741,731 A * 4/1998 Yuuki ................. H01L 23/5256
                                                        257/E23.149
6,326,306 B1 * 12/2001 Lin .................... H01L 21/28562
                                                        257/E21.171
(Continued)

OTHER PUBLICATIONS

Laser and Optics User's Manual from Agilent Technologies 2002.*
(Continued)

*Primary Examiner* — Matthew C Landau
*Assistant Examiner* — Eric K Ashbahian
(74) *Attorney, Agent, or Firm* — Flener IP & Business Law; Zareefa B. Flener

(57) ABSTRACT

The present disclosure relates to the technical field of semiconductors, and in particular to a semiconductor chip, a semiconductor wafer and a method for manufacturing a semiconductor wafer. The semiconductor chip comprises: a substrate, devices provided on a side of the substrate, via holes running through the substrate, conductive material filled in the via holes and contacted with the devices, and a backside metal layer provided on the other side of the substrate away from the devices, the backside metal layer coming into contact with the conductive material so as to be electrically connected to the devices via the conductive material. The semiconductor chip, the semiconductor wafer and the method for manufacturing a semiconductor wafer of the present disclosure reduce the ground resistance and improve the heat dissipation of devices with via holes structure during the operation.

19 Claims, 9 Drawing Sheets

(51) Int. Cl.
*H01L 21/20* (2006.01)
*H01L 21/308* (2006.01)
*H01L 23/00* (2006.01)

(52) U.S. Cl.
CPC .. *H01L 21/76243* (2013.01); *H01L 21/76264* (2013.01); *H01L 24/84* (2013.01); *H01L 29/40* (2013.01)

(58) Field of Classification Search
CPC ......... H01L 21/76879; H01L 21/76849; H01L 23/5226; H01L 23/528; H01L 23/5384; H01L 29/41725; H01L 29/778–7789; H01L 29/40–41; H01L 31/022441; H01L 2924/13064; H01L 21/76897; H01L 21/768; H01L 21/7816; H01L 23/5283; H01L 23/5286
See application file for complete search history.

(56) References Cited

U.S. PATENT DOCUMENTS

| | | | |
|---|---|---|---|
| 2012/0043592 A1* | 2/2012 | Zhao | H01L 21/76847 257/288 |
| 2012/0115327 A1* | 5/2012 | Miki | H01L 21/3081 438/667 |
| 2013/0288401 A1* | 10/2013 | Matsuura | H01L 22/10 438/14 |
| 2013/0341620 A1* | 12/2013 | Birner | H01L 22/30 257/48 |
| 2014/0184314 A1* | 7/2014 | Takahashi | G01R 31/3613 327/524 |
| 2016/0260633 A1* | 9/2016 | Lin | H01L 21/28518 |
| 2016/0377910 A1* | 12/2016 | Ito | G02F 1/133345 257/72 |
| 2017/0104064 A1* | 4/2017 | Aoki | H01L 29/7786 |
| 2017/0330940 A1* | 11/2017 | Lee | H01L 21/76898 |

OTHER PUBLICATIONS https://www.engineeringtoolbox.com/linear-expansion-coefficients-d_95.html (As early as 2006) (Year: 2006).*
http://www/engineeringtoolbox.com/linear-expansion-coefficients-d_95.html (As early as 2006) (Year: 2006).*
https://www.merriam-webster.com/dictionary/integrally (Year: 2016).*

* cited by examiner

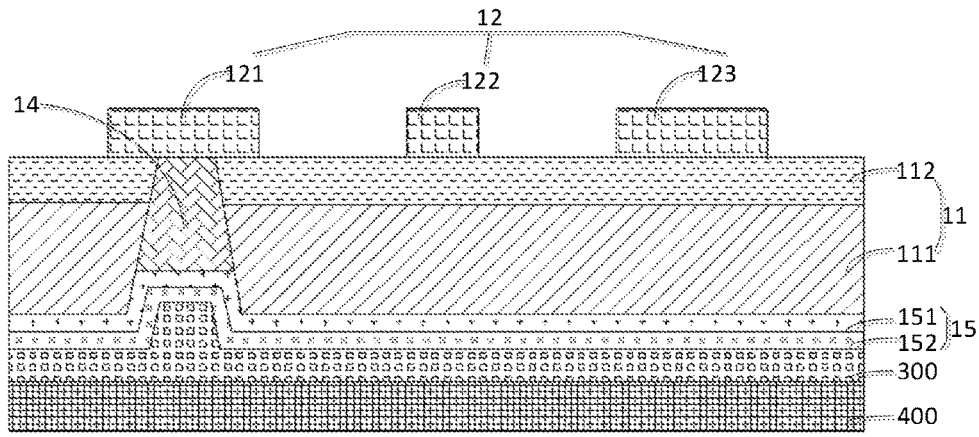

FIG. 16

S1031: Forming a mask layer on a side of the substrate sheet away from the substrate support S1032: Forming a layer of photoresist on the mask layer, using a photolithographic plate to irradiate the photoresist to form a patterned protection layer S1033: Removing a portion of the mask layer which is not covered by the protection layer to form a patterned mask layer, and exposing a portion of the substrate sheet 111

S1034: Etching the exposed portion of the substrate sheet to form a plurality of through holes running through the substrate, and removing the patterned mask layer

FIG. 17

S1051: Forming a seed metal layer on a side of the substrate away from the device S1052: Forming a backmetal metal layer on a side of the seed metal layer away from the substrate

FIG. 18

S1061: Forming a patterned corrosion barrier layer on a side of the backside metal layer away from the substrate S1062: Corroding off a portion of the backside metal layer not covered by the patterned corrosion barrier layer

FIG. 19

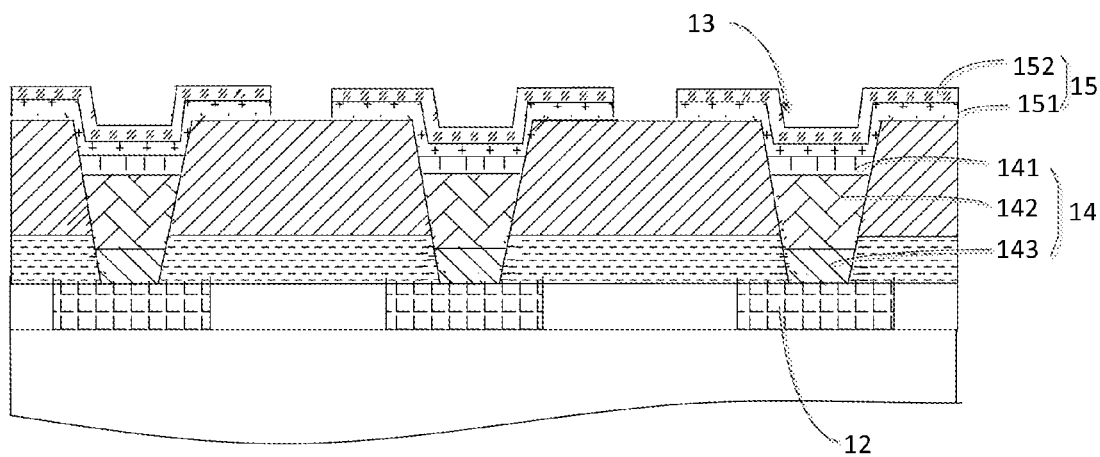

FIG. 20

SEMICONDUCTOR CHIP, SEMICONDUCTOR WAFER AND METHOD FOR MANUFACTURING SEMICONDUCTOR WAFER

CROSS-REFERENCE TO RELATED APPLICATIONS

This application is a continuation of International Application No. PCT/CN2017/084120, filed on May 12, 2017, which claims the priority of Chinese Patent Application No. 201611209475.7, filed on Dec. 23, 2016, entitled "SEMICONDUCTOR CHIP, SEMICONDUCTOR WAFER AND METHOD FOR MANUFACTURING SEMICONDUCTOR WAFER", both of the aforementioned are hereby incorporated by reference in their entireties.

TECHNICAL FIELD

The present disclosure relates to the technical field of semiconductors, and in particular to a semiconductor chip, a semiconductor wafer and a method for manufacturing a semiconductor wafer.

BACKGROUND

Compared with the first-generation semiconductor Si and the second-generation semiconductor GaAs, GaN semiconductor material is more suitable for manufacturing of electronic devices of high temperature, high voltage, high frequency and high power due to its distinct advantages such as wide band gap, high saturated electron drift velocity, high breakdown field strength and high temperature-resistance. The GaN semiconductor material has great application prospect and thus has become a hot spot for research in the semiconductor industries.

GaN high electron mobility transistors (HEMT), as GaN devices formed by two dimensional electron gas at AlGaN/GaN heterojunctions, may be applied in situations requiring high frequency, high voltage and high power. When a GaN device is packaged, a throughhole structure is generally employed to increase the device gain and reduce the ground resistance. Via holes in such a structure are generally introduced by etching from a backside of a substrate, and the semiconductor device is grounded by grounding the backside of the substrate. Specifically, via holes run through a substrate and a semiconductor layer made of nitrides and to a source electrode, so that the source electrode is connected with the backside of the grounded substrate by the via holes.

At present, there are mainly two approaches of positioning the via holes for a GaN device. One approach is to form the via holes in a metal PAD area. In this approach, since the via holes are located on a same side of an active area, the current in the active area entirely flows in a same direction without being dispersed although the influence of the via holes on heat dissipation of the devices is weakened. As a result, mutual inductance is generated between metal fingers in the active area. Furthermore, this approach allows the distance from the source electrode within the active area to the ground to be increased as well. That is to say, the ground resistance of the source electrode is increased, and thus the properties of the devices such as gain are influenced. The other approach is to form the via holes below the source electrode located in the active area. As for this approach, because the source electrodes within each active area may be directly grounded by the via holes, the distance from source electrode within the active area to the ground is reduced and the ground resistance is thus reduced. However, this approach which arranges all the via holes in the active area will severely affect the heat dissipation of the devices, thus restricting the power design for the devices. This is because the active area is an area where heat is generated intensively in the devices and a throughhole structure is generally a hollow one, and the hollow throughhole structure will destroy the heat dissipation of the substrate.

SUMMARY

Accordingly, an objective of the present disclosure is to provide a semiconductor chip, a semiconductor wafer and a method for manufacturing a semiconductor wafer, so as to reduce the ground resistance and improve the heat dissipation of devices with via holes structure during the operation.

An aspect of the present disclosure provides a semiconductor chip, including: a substrate; devices provided on a side of the substrate; via holes running through the substrate; conductive material filled in the via holes and contacted with the devices; and a backside metal layer provided on the other side of the substrate away from the devices, the backside metal layer coming into contact with the conductive material so as to be electrically connected to the devices by the conductive material.

Preferably, the amount of the conductive material filled in the via holes is 50% to 98% of the volume of the via hole.

Preferably, the conductive material is anyone or a combination of Cu, Ti, Ni, W, Pt and Au.

Preferably, the conductive material includes a multi-portion structure, and each portion is made of one or any combination of the metals as above.

Preferably, the metal in a middle portion of the multi-portion structure has a thermal expansion coefficient less than that of the metal on the two sides thereof.

Preferably, the multi-portion structure is a multilayer structure in a direction from an inside wall of the via hole to an axis of the via hole.

Preferably, the device includes a source electrode, and a portion, which contacts with the source electrode, in the multi-portion structure is made of the same metal as the source electrode.

Preferably, the multi-portion structure is a multilayer structure in a direction of the axis of the via hole.

Preferably, the backside metal layer includes a back-metal metal layer and a seed metal layer, the seed metal layer being located on a side of the substrate away from the devices and covering the via hole, the back-metal metal layer being located on a side of the seed metal layer away from the substrate and covering the seed metal layer.

Preferably, the seed metal layer contains at least one of Ti, Ni, W, Pt and Au.

Preferably, the back-metal metal layer contains at least one of Au, Cu and Au—Sn alloy.

Preferably, the back-metal metal layer has a thickness between 2 µm and 10 µm.

Preferably, the device includes a source electrode, a gate electrode and a drain electrode, and the conductive material contacts with the source electrode.

Another aspect of the present disclosure provides a semiconductor wafer, including: a substrate; a plurality of devices provided on a side of the substrate; a plurality of via holes running through the substrate and corresponding to the plurality of devices; conductive material respectively filled in the plurality of via holes and contacted with the plurality of devices; and a backside metal layer provided on the other side of the substrate away from the devices, the backside metal layer coming into contact with the conductive material so as to be electrically connected to the devices respectively via the conductive material.

Preferably, the amount of the conductive material filled in the plurality of via holes is 50% to 98% of the volume of the plurality of via holes.

Preferably, the backside metal layer includes a back-metal metal layer and a seed metal layer, the seed metal layer being located on a side of the substrate away from the devices and covering the via hole, the back-metal metal layer being located on a side of the seed metal layer away from the substrate and covering the seed metal layer.

Yet another aspect of the present disclosure provides a method for manufacturing a semiconductor wafer, including: providing a substrate; forming a plurality of devices on a side of the substrate; forming, from a side of the substrate away from the devices and corresponding to the plurality of devices, a plurality of via holes running through the substrate; filling conductive material in the plurality of via holes respectively, so that the conductive material contacts with the plurality of devices respectively; forming a backside metal layer on a side of the substrate away from the devices, so that the backside metal layer contacts with the conductive layer so as to be electrically connected to the devices via the conductive material respectively.

Preferably, the amount of the conductive material filled in the plurality of via holes is 50% to 98% of the volume of the plurality of via holes.

Preferably, forming a backside metal layer on a side of the substrate away from the devices includes: forming a seed metal layer on a side of the substrate away from the devices, the seed metal layer covering the plurality of via holes; and forming a back-metal metal layer on a side of the seed metal layer away from the substrate, the back-metal metal layer covering the seed metal layer.

The semiconductor chip of the present disclosure contacts with the backside metal layer and the devices by the conductive material in the via hole, thus reducing the ground resistance of the devices and improving the heat dissipation of the semiconductor devices with via holes structure during the operation.

BRIEF DESCRIPTION OF DRAWINGS

To describe the technical solutions in the embodiments of the present disclosure more clearly, drawings to be used in the description of the embodiments will be briefly introduced below. It should be understood that the drawings below only show some embodiments of the present disclosure, and should not be considered as limitations to the scope. Other relevant drawings may be obtained by a person of ordinary skill in the art according to those drawings without paying any creative effort.

FIG. 16 is a schematic view of packaging a single semiconductor chip according to an embodiment of the present disclosure;

FIG. 17 is a process flowchart of sub-steps of the step S103 in FIG. 3;

FIG. 18 is a process flowchart of sub-steps of the step S105 in FIG. 3; and

FIG. 19 is a process flowchart of sub-steps of the step S106 in FIG. 3.

FIG. 20 to FIG. 21 are schematic views of two types of semiconductor wafer with multi-portion structure and backside metal layer according to embodiments of the present disclosure.

DETAILED DESCRIPTION

Figure 1:
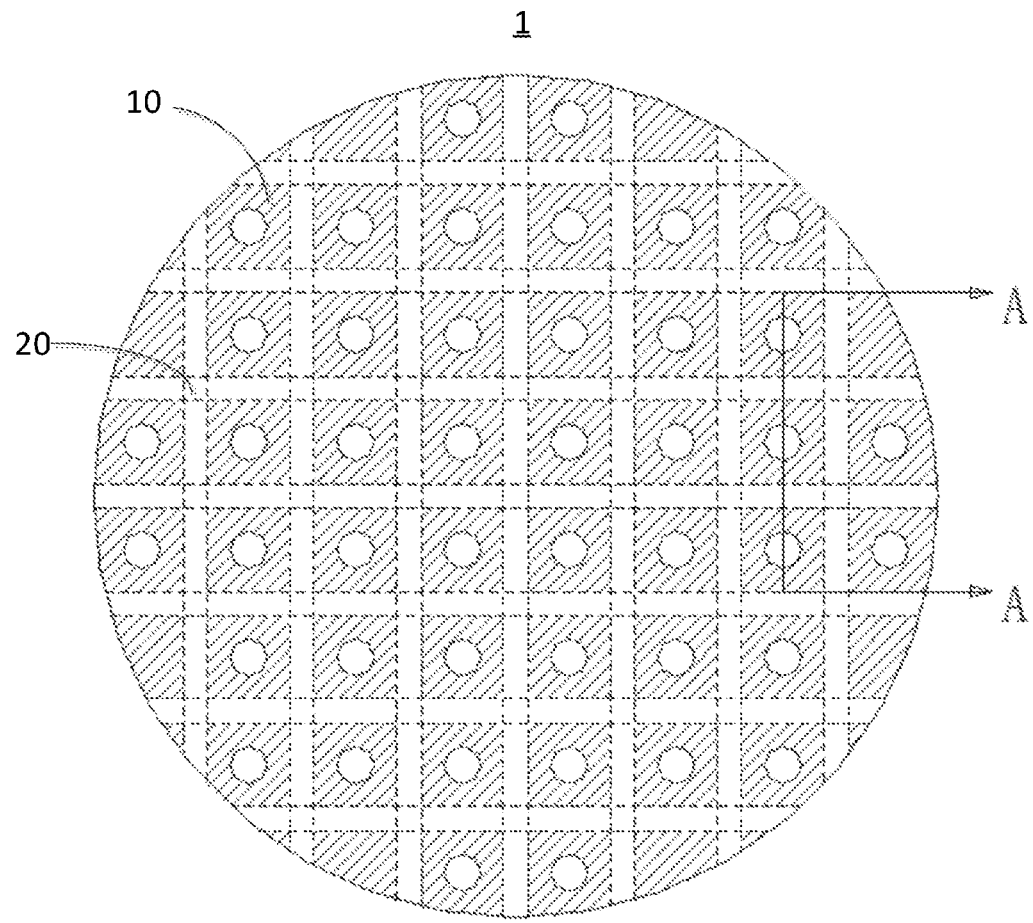
FIG. 1 is a planar structure diagram of a semiconductor wafer according to an embodiment of the present disclosure.

The technical solutions in the embodiments of the present disclosure will be described clearly and completely below in combination with the accompanying drawings in the embodiments of the present disclosure. Apparently, the embodiments described are merely some but not all the embodiments of the present disclosure. It should be understood by those skilled in the art that the components shown in the drawings of the present disclosure and described according to the drawings may be configured in different ways.

The detailed description of the embodiments of the present disclosure shown in the drawings is not intended to limit the protection scope of the present disclosure but merely to show selected embodiments of the present disclosure. Based on the embodiments of the present disclosure, all other embodiments obtained by those skilled in the art without paying any creative effort belong to the protection scope of the present disclosure.

It should be noted that, in the drawings below, like reference characters and letters denote like items. Thus, once a certain item is defined in one drawing, there is no need to define and explain it again in the subsequent drawings.

FIG. 1 is a semiconductor wafer 1 according to an embodiment of the present disclosure. Referring to FIG. 1, this semiconductor wafer 1 includes a plurality of semiconductor chips 10 and a scribe line 20 arranged between two adjacent semiconductor chips 10 at intervals. Preferably, in this embodiment, the plurality of semiconductor chips 10 may be arranged in a matrix manner in the plane of the semiconductor wafer 1. In one embodiment of the present disclosure, one scribe line 20 or a segment of a scribe line 20 is arranged between any two adjacent semiconductor chips 10. In the embodiment shown in FIG. 1, two adjacent scribe lines 20 in a same extension direction are connected to each other, and two adjacent scribe lines 20 in different extension directions are intersected with each other.

Figure 2:
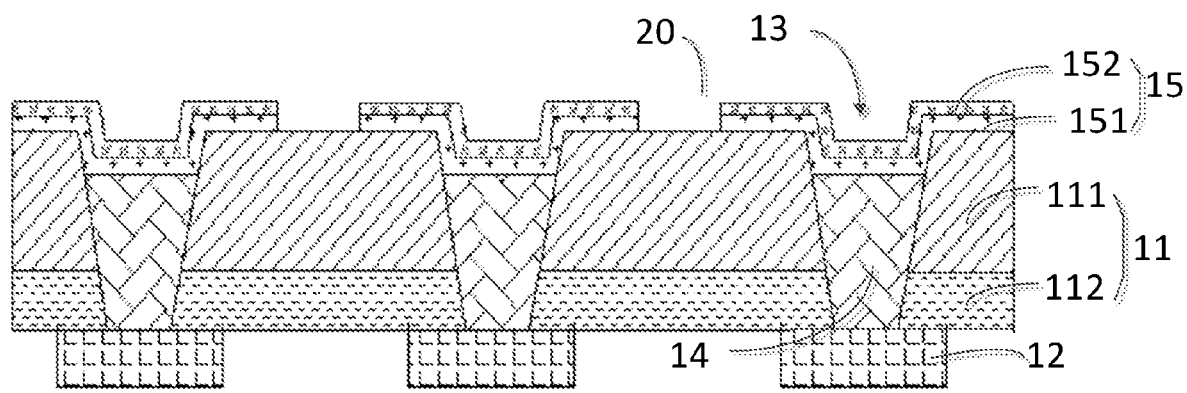
FIG. 2 is a cross-sectional view of the semiconductor wafer along a line A-A of FIG. 1 according to an embodiment of the present disclosure.

FIG. 2 is a cross-sectional view of the semiconductor wafer along a line A-A in FIG. 1 according to an embodiment of the present disclosure. FIG. 2 shows cross-section structures of three semiconductor chips 10 in the semiconductor wafer 1. This semiconductor chip 10 includes a substrate 11 and devices 12 provided on a side of the substrate 11. For example, the devices 12 and the substrate 11 may form an integrated structure. The semiconductor chip 10 also includes via holes 13 running through the substrate 11, conductive material 14 filled in the via holes 13 and contacted with the devices 12, and a backside metal layer 15 formed on a side of the substrate 11 opposite to the device 12. The backside metal layer 15 contacts with the conductive material 14 so as to be electrically connected to the devices 12 via the conductive material 14. Arranging the conductive material 14 in the via holes 13 allows the semiconductor chip 10 to have low ground resistance and good heat dissipation.

Preferably, the substrate 11 may include a substrate sheet 111 and an epitaxial layer 112 grown on the substrate sheet 111. The substrate sheet 111 may be formed of any one of Si, sapphire, SiC and GaAs, and the epitaxial layer 112 may be formed of any one or two of GaN and AlGaN. The devices 12 are located on a side of the epitaxial layer 112 away from the substrate sheet 111, the backside metal layer 15 is located on a side of the substrate 111 away from the epitaxial layer 112, and the via holes 13 run through the epitaxial layer 112 and the substrate sheet 111. In other embodiments, the epitaxial layer 112 maybe omitted as well, and the substrate 11 may be directly formed of the substrate sheet 111.

Figure 4:
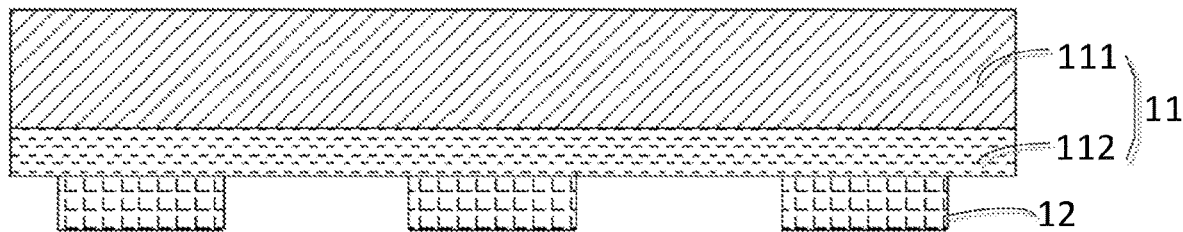
FIG. 4 to FIG. 13 are structure diagrams of manufacturing each component of the semiconductor wafer respectively in each process step of the method for manufacturing a semiconductor wafer according to an embodiment of the present disclosure.

Preferably, the devices 12 may include a source electrode 121, a gate electrode 122 and a drain electrode 123 (referring to FIG. 4-416). The via holes 13 are located below a source electrode 121 in the active area, and the conductive material 14 filled in the via holes 13 contacts with the source electrode 121. Preferably, the devices 12 may also include a source electrode PAD, and the via holes 13 are located below the source electrode PAD, and the conductive material 14 filled in the via holes 13 may come into contact with the source electrode PAD. The shape of the cross-section of the via holes 13 may be a circle, an oval or any other shapes. The shape of the profile of the via holes 13 along the axis direction of the via holes 13 may be a trapezium and any other shapes.

For example, the conductive material 14 is good at conducting electricity and heat. Preferably, the conductive material 14 may be, but not limit to, Cu, Ti, Ni, W, Pt, Au or other kinds of metal material. Preferably, the conductive material 14 belongs to a same kind of metal as that of the source electrode 121. For example, the conductive material 14 maybe arranged in a multi-portion structure and each portion among the multiple portions is made of one or more kinds of metal. For example, the conductive material may be a sandwich structure having three portions (for example, each portion being made of one or more metal layers). With respect to conductive material 14 having a three-portion sandwich structure, for example, material having good electrical conductivity may be used in a portion of the conductive material 14 coming into contact with the source electrode 121, for example, the material at this portion of the conductive material 14 may be the same as that of the source electrode metal. For example, the contacted portion includes a Ti metal layer and an Au metal layer. Metal (for example, Pt) with a small thermal expansion coefficient t with respect to that of the metal layer on the two sides may be selected as the metal located in the middle portion of the conductive material 14. In this way, the generation of structural stress is avoided and the conductive material 14, when heated, is prevented from damaging the semiconductor devices. In addition, the metal in the middle portion may have a thickness, for example, 2 to 10 folds of that of the metal portion on the two sides, so that the amount of thermal expansion of the conductive material 14 when heated is further reduced and the electrical conductivity of the conductive material 14 will not be weakened. The metal layer of the conductive material 14 contacting with the backside metal layer 15 may be made of metal with good electrical conductivity, for example, the material of the conductive material may be the same as that of the backside metal layer 15.

In other embodiments, the conductive material may also be replaced by conductive oxides such as ITO and IZO. Under a case that oxides are used as the conductive material 14, carbon nanotubes may be further doped in these conductive oxides to both improve the electricity and heat conductivity of the conductive material 14, therefore allowing the semiconductor devices to have better heat-resistant and gain prosperities.

In one embodiment of the present disclosure, the conductive material 14 in the via holes 13 is 50% to 98% of the volume of the via holes 13, so as to avoid the phenomenon that the stress resulted from difference in the thermal expansion coefficients of different kinds of material may not be relieved when the via holes 13 are fully filled with conductive material 14.

Figure 14:
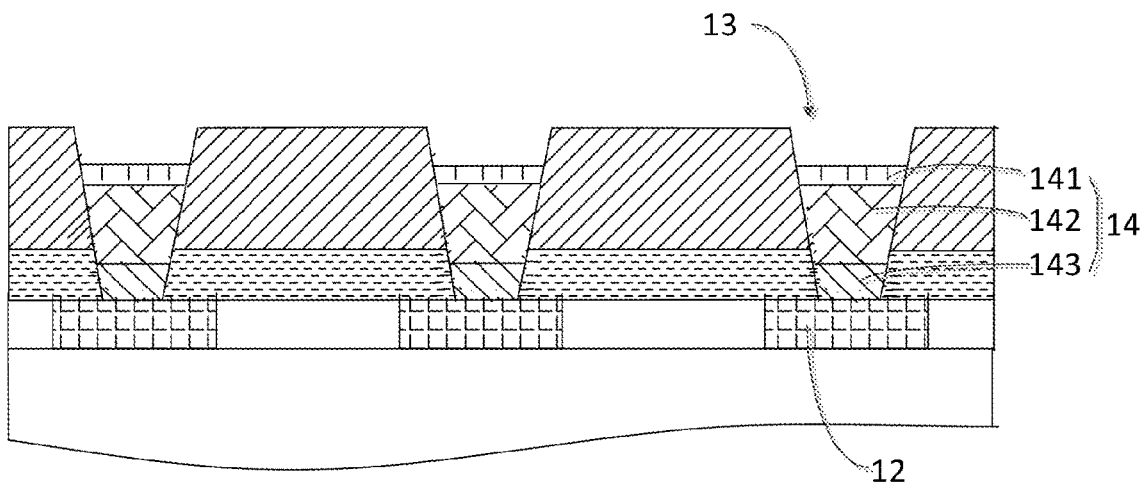
FIG. 14 to FIG. 15 are schematic views of two types of multi-portion structure semiconductor wafers according to embodiments of the present disclosure.
Figure 15:
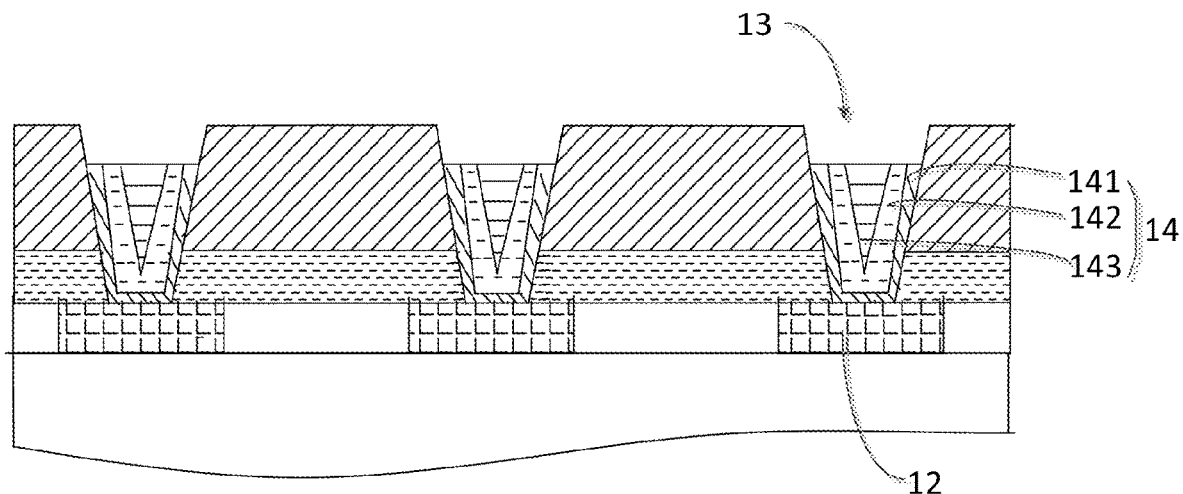

Also, in the above embodiment, further, the conductive material 14 may be a multi-portion structure. For example, the multi-portion structure may be formed by stacking one layer on another in an axial direction of the via hole 13, referring to FIG. 14; and the multi-portion structure may also be formed by stacking one layer on another in a direction from an inside wall of the via hole to the axis, referring to FIG. 15. When the conductive material is of multi-portion structure formed by stacking in the direction of the axis of the via hole, the conductive portion 141 which contacts with the source electrode 121 has, in the axial direction of the via hole 13, a size of ½ to ¹⁄₁₀ of that of the other portion (when the conductive material 14 has two portions), or of ½ to ¹⁄₁₀ of the sum of sizes, in the axial direction of the via holes 13, of the other two layers 142, 143 (when the conductive material 14 has three portions). Referring to FIG. 14, the portion 141 which contacts with the source electrode 121 may have good electrical conductivity, and the other portions of the conductive material 14 may have small expansion coefficients. In addition, in the structure shown in FIG. 14, the portion 141 contacted with the source electrode 121 may be made of the same kind of metal, and further the same metal, as that of the source electrode 121. By arranging the conductive material in multiple portions and adjusting the size relation between the multiple portions, and by filling a portion of the conductive material in the via holes 13, the expansion of the material may be further reduced, so that the semiconductor devices are free from damages when heated and low ground resistance may be maintained. Preferably, the conductive material is a multi-portion structure formed by stacking one layer on another in the direction from the side wall of the via hole to the axis of the via hole. Since the current flows from the source electrode 121 to the back-metal metal 15 along the metal on the side wall of the via hole, when the portion 141 that contacts with the source electrode 121 has good electrical conductivity, the current will be directly leaded into the backside metal layer 15 along the portion 141. In the embodiment in FIG. 15, a surface of the conductive material, which has a multi-portion structure, away from the bottom of the via holes may be a plane or a concave. Specifically, in FIG. 15, a surface, away from the bottom of the via hole, of the conductive material 14 filled in the via holes 13 is a surface sunk toward the bottom of the via hole 13. It has to be noted that the bottom of the via hole is a side of the via hole close to the devices.

In one implementation, the backside metal layer 15 may include a back-metal metal layer 152 and a seed metal layer 151. The seed metal layer 151 is located on a side of the substrate 11 away from the devices 12 and covers the via holes 13. The seed metal layer 151 contacts with the conductive material 14 so as to be electrically connected to the devices 12 via the conductive material 14. Preferably, the seed metal layer 151 may be, but not limited to, at least one of Ti, Ni, W, Pt and Au. The back-metal metal layer 152 is located on a side of the seed metal layer 151 away from the substrate 11 and covers the seed metal layer 151. Preferably, the back-metal metal layer 152 may be, but not limited to, at least one of Au, Cu and Au—Sn alloy. The back-metal metal layer 152 has a thickness between 2 µm and 10 µm. Preferably, the seed metal layer 151 may be made of the same material as the conductive material 14, so as to further reduce the ground resistance of the semiconductor devices. In addition, both the seed metal layer 151 and the conductive material 14 may be made of Pt alloy material, so that a smaller thermal expansion coefficient may be provided while maintaining low ground resistance.

Figure 3:
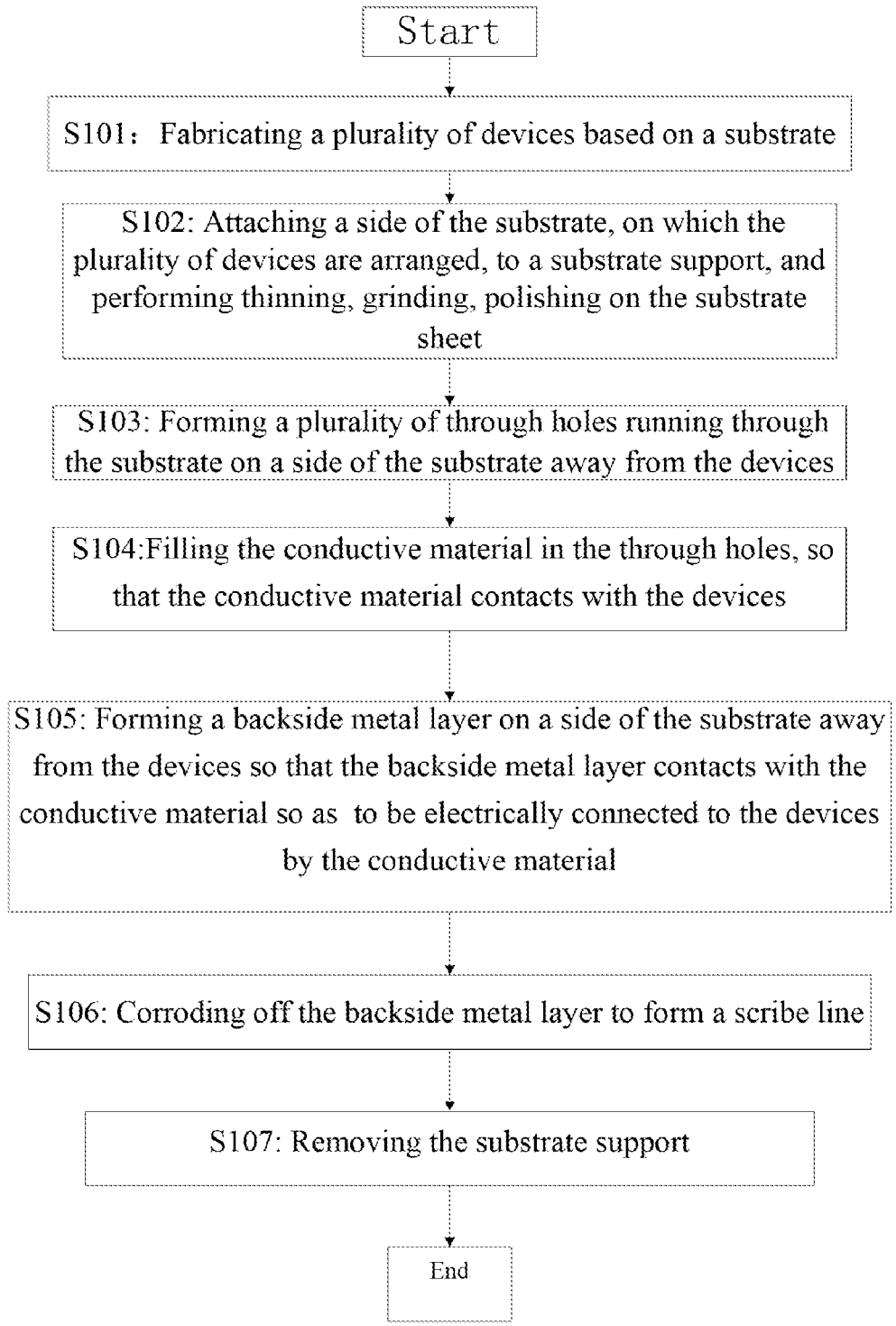
FIG. 3 is a flowchart of a method for manufacturing a semiconductor wafer according to an embodiment of the present disclosure.

FIG. 3 shows a process flowchart of a method for manufacturing a semiconductor wafer 1 according to an embodiment of the present disclosure. Referring to FIG. 3, the method for manufacturing the semiconductor wafer 1 includes steps S101 to S107. This flowchart will be described below in detail with reference to FIG. 4 to FIG. 13. It should be noted that the method of the present disclosure is not limited by FIG. 3 and the specific orders described below. It should be understood that, in other embodiments, the order of some steps in the method described in the present disclosure may be interchanged as required, or some steps thereof may also be omitted or deleted.

Step S101: a plurality of devices 12 are made based on a substrate 11, as shown in FIG. 4. In one implementation, an epitaxial layer 112 may be firstly grown on a substrate sheet 111 to form a substrate 11, and a plurality of devices 12 are made on a side of the epitaxial layer 112 away from the substrate sheet 111. Specifically, on a surface of the substrate 11 (for example, a surface of the epitaxial layer 112), patterned devices 12 may be formed by photolithography, depositing, etching and other processes.

Figure 5:
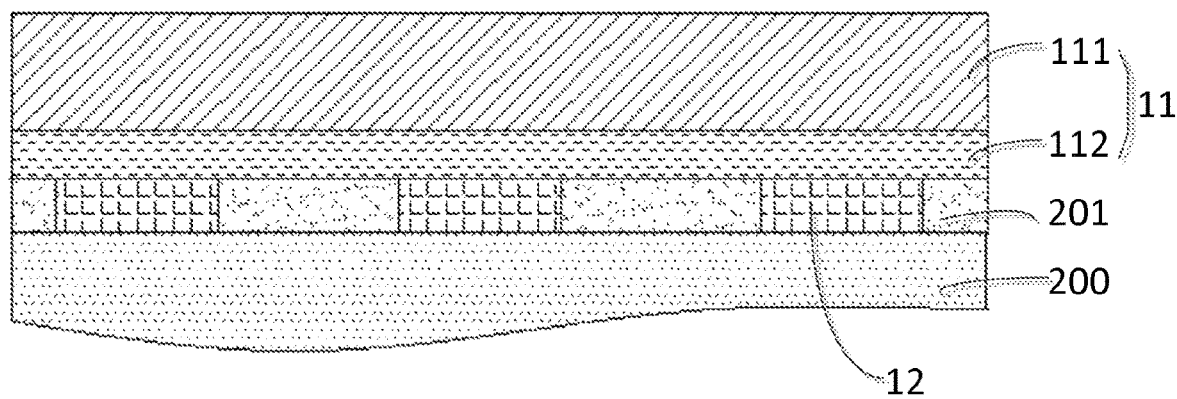

Step S102: a side of the substrate 11, on which the plurality of devices 12 are arranged, is attached to a substrate support 200, and thinning, grinding, polishing and other processes are performed on the substrate sheet 111, as shown in FIG. 5. Preferably, an adhesive 201 (for example, an optical adhesive, OCA, OCR, Wax, etc.) may be used for the attachment. The substrate support 200 may be made of sapphire, glass, SiC and silicon slice, etc. The substrate sheet 111 of the substrate 11 is thinned to be between 50 µm to 200 µm. This is because, if the subsequent photolithography, etching, metalizing and other processes are performed on the substrate 11 separately in such a thickness, the substrate 11 is likely to break. Thus, in this embodiment, the substrate 11 is firstly attached onto the substrate support 200, and then thinning and other processes are performed thereon so as to prevent the substrate 11 from breaking in the subsequent manufacturing processes. It may be understood that, in other embodiments, the step S102 may also be omitted as long as the substrate 11 will not break.

Step S103: a plurality of via holes 13 running through the substrate 11 are formed on a side of the substrate 11 away from the devices 12. For example, the positions of the plurality of via holes 13 correspond to those of the plurality of devices 12. When implemented specifically, the step S103 may also include the following sub-steps S1031 to S1034, referring to FIG. 15.

Figure 6:
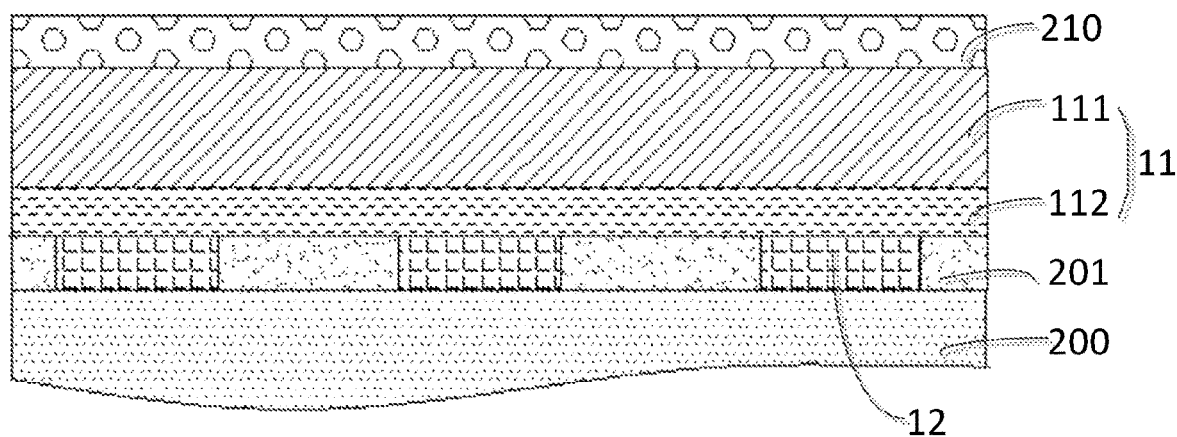

Sub-step S1031: a mask layer 210 is formed on a side of the substrate sheet 111 away from the substrate support 200, as shown in FIG. 6. The mask layer 210 may be formed by sputtering, electroplating, depositing and other methods. The mask layer 210 may be formed of one of Ni, Al, $SiO_2$, SiN or a combination thereof.

Figure 7:
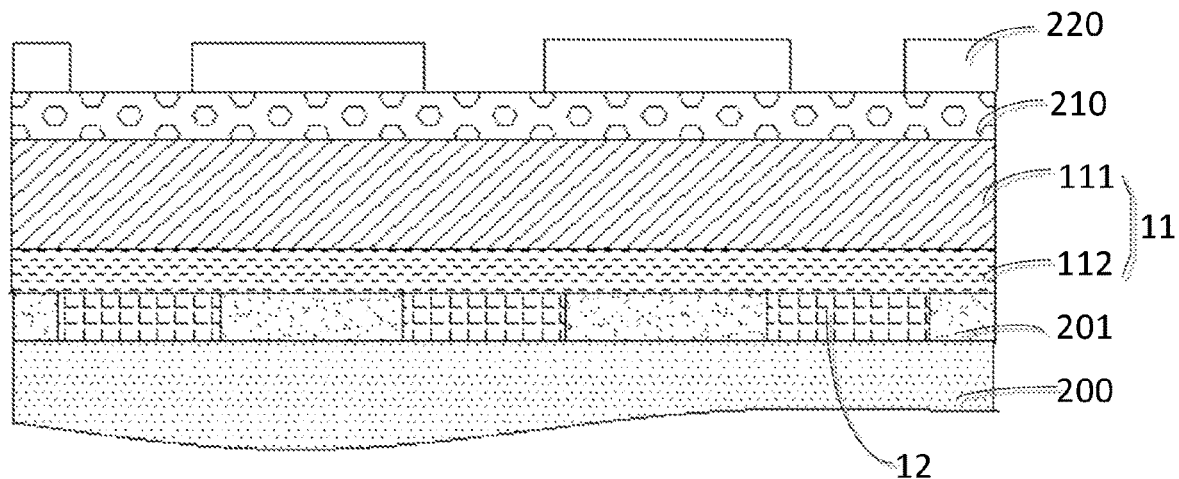

Sub-step S1032: a layer of photoresist is formed on the mask layer 210, and a photolithographic plate is used to irradiate the photoresist to form a patterned protection layer 220, as shown in FIG. 7. The photolithographic plate includes a light transmission portion corresponding to the via holes 13.

Figure 8:
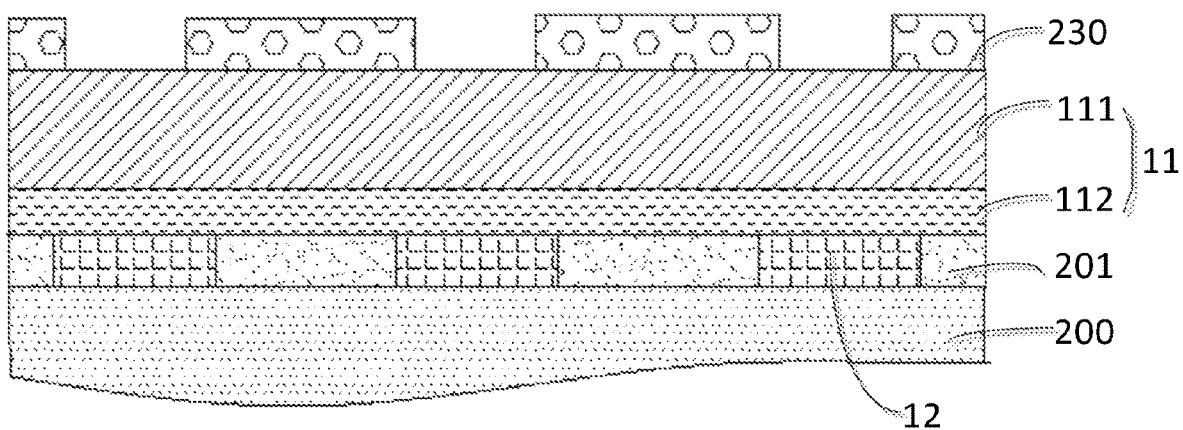

Sub-step S1033: a portion of the mask layer 210 which is not covered by the protection layer is removed to form a patterned mask layer 230, and a portion of the substrate sheet 111 is exposed, as shown in FIG. 8.

Figure 9:
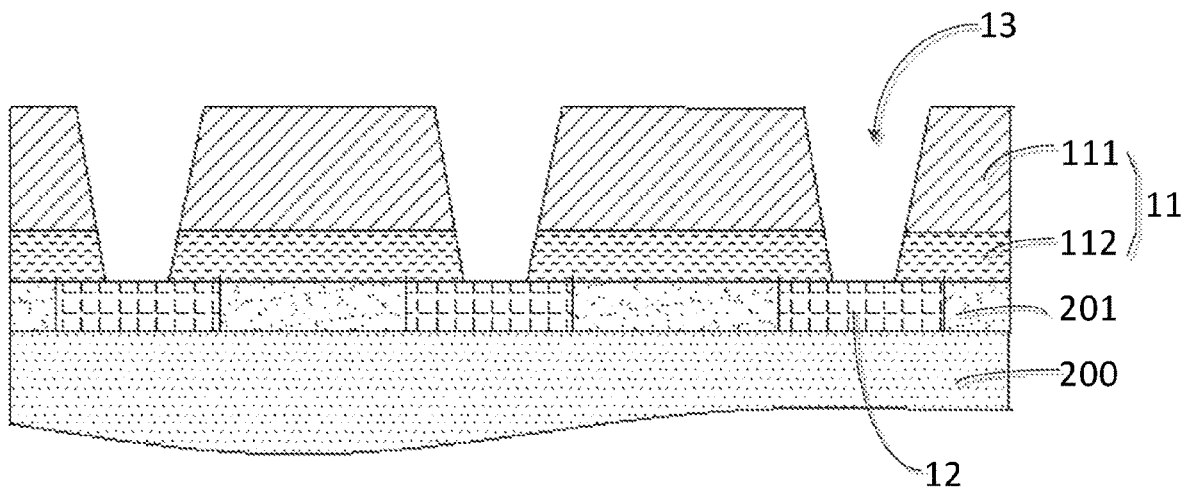

Sub-step S1034: the exposed portion of the substrate sheet 111 is etched to form a plurality of via holes 13 running through the substrate 11, and the patterned mask layer 230 is removed, as shown in FIG. 9. Specifically, the exposed portion of the substrate sheet 111 may be etched by etching apparatuses such as RIE (Reactive Ion Etching), ICP (Inductively Coupled Plasma), IBE (Ion Beam Etching) and ERC.

Figure 10:
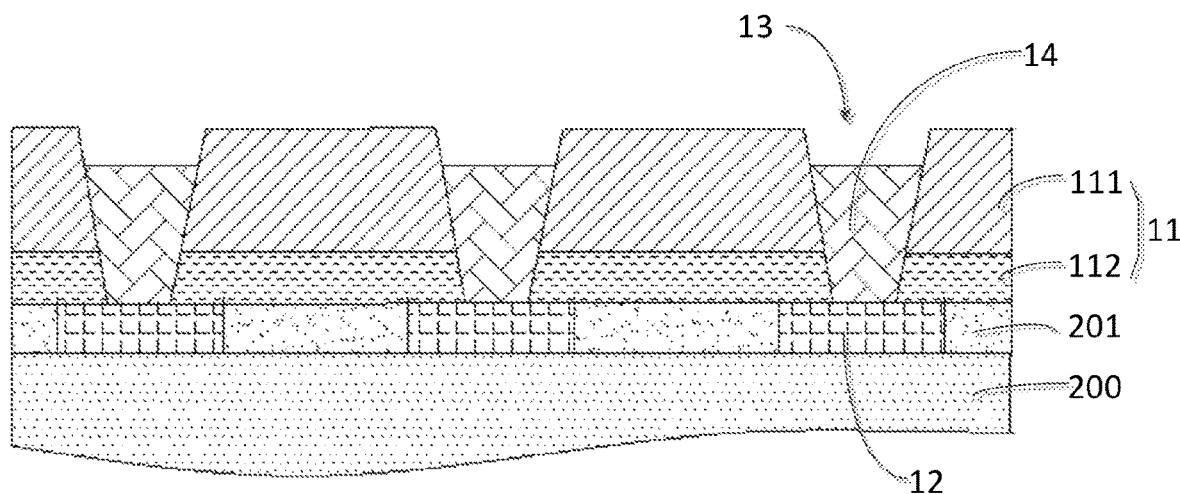

Step S104: the conductive material 14 is filled in the via holes 13, so that the conductive material 14 contacts with the devices 12, as shown in FIG. 10. For example, since the positions of the via holes 13 correspond to that of the devices 12, after the conductive material 14 is filled in the via holes 13, an end of the conductive material 14 close to the devices 12 contacts with the devices 12. In a case that the device 12 includes a source electrode 121, a drain electrode 122 and a gate electrode 123, for example, the conductive material 14 contacts with the source electrode 121 of the device 12. Preferably, the conductive material 14 is formed of metal. Preferably, the conductive material 14 may be made of the same metal as that of the source electrode 121. The amount of the conductive material 14 filled in the via holes 13 is 50% to 98% of the volume of the via holes 13. The filling amount mentioned herein is the size of the filling material 12 in the direction of axis of the via holes 13.

Figure 11:
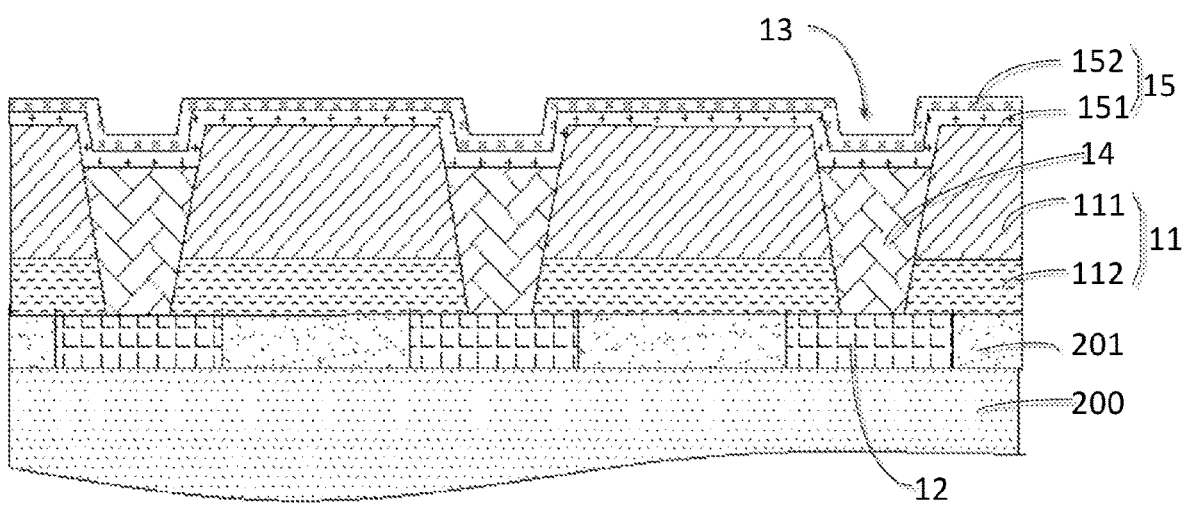

Step S105: a backside metal layer 15 is formed on a side of the substrate 11 away from the devices 12 so that the backside metal layer 15 contacts with the conductive material 14 so as to be electrically connected to the devices 12 via the conductive material 14, as shown in FIG. 11. Preferably, the backside metal layer 15 may include a back-metal metal layer 152 and a seed metal layer 151. During the specific implementation, the step S105 includes sub-steps S1051 to S1052, referring to FIG. 18.

Sub-step S1051: a seed metal layer 151 is formed on a side of the substrate 11 away from the devices 12, so that the seed metal layer 151 covers the via holes 13. For example, the way for forming the seed metal layer 151 is to deposit a layer or multiple layers of metal on a side of the substrate 11 away from the devices 12. For example, when this metal layer is deposited, the via holes 13 filled with the conductive material 14 are not covered. Therefore, this layer of metal not only covers a side of the substrate 11 away from the devices 12 and also a side of the conductive material 14 away from the devices 12, so that the seed metal layer 151, together with the conductive material 14, may form a conductor to make the devices 12 grounded.

Sub-step S1052: a back-metal metal layer 152 is formed on a side of the seed metal layer 151 away from the substrate 11, and the back-metal metal layer 152 covers the seed metal layer 151.

Step S106: the backside metal layer 15 is corroded off to form a scribe line 20. During the specific implementation, the step S106 includes sub-steps S1061 to S1062, referring to FIG. 19.

Figure 12:
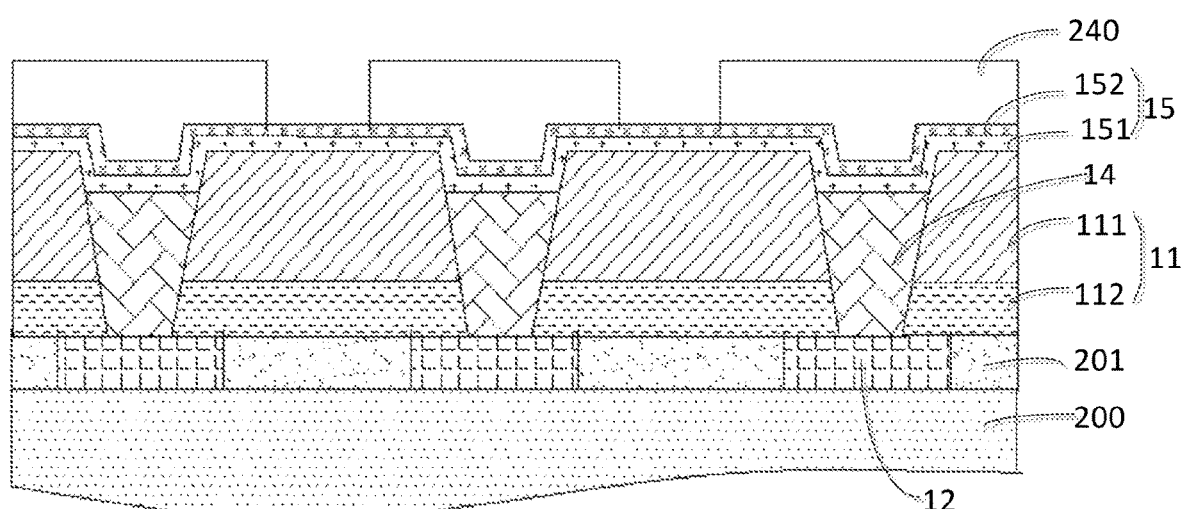

Sub-step S1061: a patterned corrosion barrier layer 240 is formed on a side of the backside metal layer 15 away from the substrate 11, as shown in FIG. 12. Specifically, a layer of photoresist may be formed firstly by coating over the backside metal layer 15, for example, the photoresist may be positive photoresist or negative photoresist. Then, the photoresist is photolithographed to form patterned corrosion barrier layer 240. The patterned corrosion barrier layer 240 may be formed by irradiating and developing the photoresist.

Figure 13:
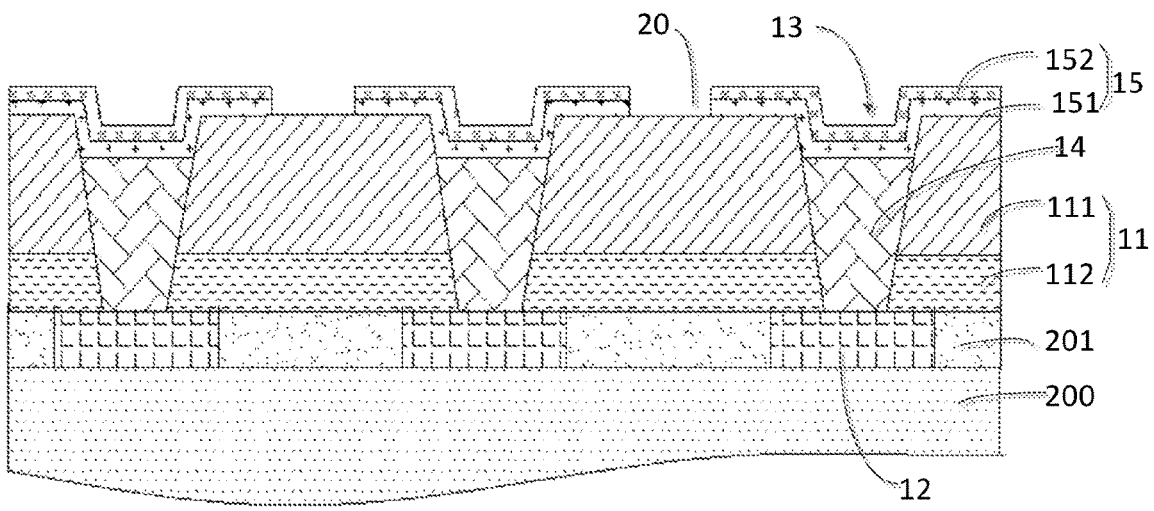

Sub-step S1062: a portion of the backside metal layer 15 not covered by the patterned corrosion barrier layer 240 is corroded off to form the scribe line 20; and the patterned corrosion barrier layer 240 is removed, as shown in FIG. 13.

Step S107: the substrate support 200 is removed to form the semiconductor wafer 1 as shown in FIG. 2. In practical use, the semiconductor wafer 1 may be scribed along the scribe line 20 of this semiconductor wafer 1, so that a plurality of independent semiconductor chips 10 may be formed.

Finally, as shown in FIG. 4-416, a single semiconductor chip 10 may be packaged by using welding material 300 and a tubular shell 400. FIG. 4-416 shows the source electrode 121, the gate electrode 122 and the drain electrode 123 included in the device 12 (with respect to drawings of other semiconductor wafers, in FIG. 16, the semiconductor chip is overturned so that the devices 12 are located on the upper part of the drawing). It should be noted that, in FIG. 2 and FIGS. 4 to 13, for ease of description, only the devices 12 are shown. The specific structure of the devices 12 is thus not restricted by the specific drawing.

With regard to the semiconductor chip 10, the semiconductor wafer 1 and the method for manufacturing a semiconductor wafer 1 in the present disclosure, the conductive material 14 arranged in the via holes 13 contacts with the backside metal layer 15 and the devices so that the devices 12 are grounded. Therefore, the ground resistance of the devices 12 is effectively reduced and the heat dissipation of the devices 12 with via hole structure during the operation is improved. Meanwhile, the situation that stress resulted from difference in the thermal expansion coefficients of different kinds of material may not be relieved when the via holes 13 are fully filled with the conductive material is thus avoided.

Figure 21:
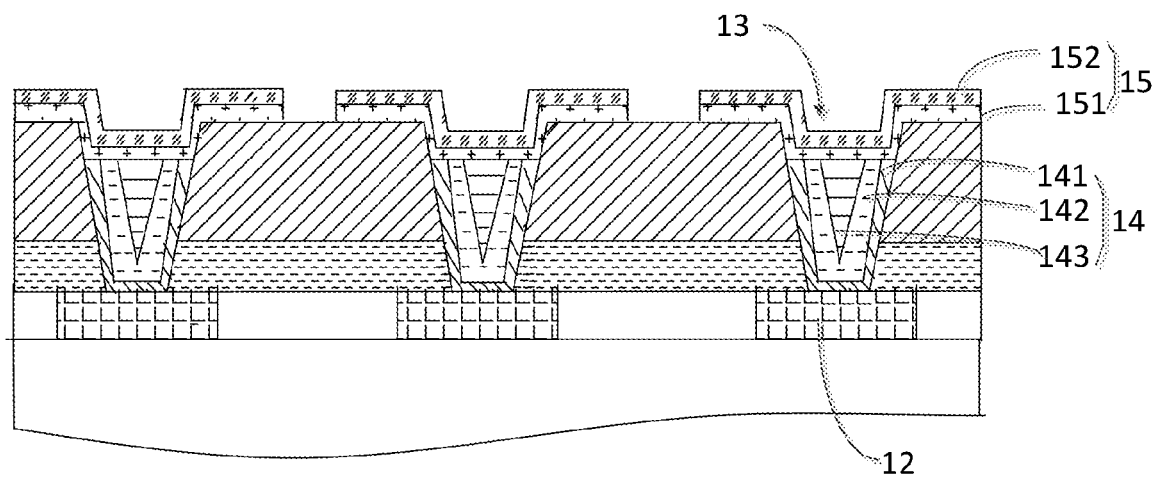

FIG. 20 and FIG. 21 each show a semiconductor chip, including: a substrate; a device 12 provided on a side of the substrate; a via hole 13 running through the substrate; conductive material 14 filled in the via holes 13 and contacted with the device 12; and a backside metal layer 15 provided on the other side of the substrate away from the device, the backside metal layer coming into contact with the conductive material 14 so as to be electrically connected to the device 12 via the conductive material 14. The conductive material 14 includes a multi-portion structure, each portion being made of one or more kinds of metal.

In the description of the present disclosure, it should be noted that, unless otherwise explicitly stated and limited, terms "provided", "communicated", and "connected" should be understood in a general sense. For example, the reference to "connected" be fixedly connected, or may be detachably connected or integrally connected. The reference to "connected" may be mechanically connected or electrically connected. The reference to "communicated" may be directly communicated or indirectly communicated by an intermediate medium, or may also be communication within two components. For a person of ordinary skill in the art, the specific meaning of the above mentioned terms in the present disclosure may be understood in specific circumstances.

In the description of the present disclosure, it should also be noted that the orientations or position relations indicated by terms such as "above", "below", "within", "outside" are orientations and position relations shown based on the accompanying drawings, or orientations and position relations of this product of the present disclosure commonly placed when used. These terms are provided only for the purpose of describing the present disclosure and simplifying the description, but not for indicating or implying that the mentioned devices or elements must have specific orientations and must be structured and operated in a specific orientation, and thus cannot be construed as limitations to the present disclosure.

The above description is merely preferred embodiments of the present disclosure and is not used to limit the present disclosure. For those skilled in the art, there may be various modifications and changes to the present disclosure. Any modifications, equivalent replacements and improvements within the spirit and principle of the present disclosure should fall into the protection scope of the present disclosure.

What is claimed is:

1. A semiconductor chip, comprising:
a substrate having a substrate sheet and an epitaxial layer grown on the substrate sheet, the epitaxial layer being made of a semiconductor material;
a device provided on a side of the substrate;
a via hole, located in the substrate and running through the substrate;
a conductive material, an entirety of the conductive material being filled in the via holes and contacted with the device; and
a backside metal layer provided on the other side of the substrate away from the device, the backside metal layer coming into contact with the conductive material so as to be electrically connected to the device via the conductive material,
wherein the conductive material comprises a multi-portion structure having three or more portions, each portion being made of one or more kinds of metal, the conductive material is embedded in the semiconductor material of the epitaxial layer, the multi-portion structure is formed by stacking one portion on another in an axial direction of the via hole, each portion of the multi-portion structure contacts a side wall of the via hole, and the conductive material contacts both of the substrate sheet and the epitaxial layer;
wherein the device comprises a source electrode made of metal, the conductive material directly contacts with the source electrode; and
a portion of the backside metal layer in contact with the conductive material extends to inside of the via hole, so that the side wall of the via hole contacts the conductive material and the backside metal layer, the conductive material cover a part of the side wall, and the backside metal layer cover other part of the side wall.

2. The semiconductor chip according to claim 1, wherein the amount of the conductive material filled in the via hole is 50% to 98% of the volume of the via hole.

3. The semiconductor chip according to claim 1, wherein the conductive material is any one or a combination of Cu, Ti, Ni, W, Pt and Au.

4. The semiconductor chip according to claim 1, wherein the backside metal layer comprises a back-metal metal layer and a seed metal layer, the seed metal layer being located on a side of the substrate away from the devices and covering the via hole, the back-metal metal layer being located on a side of the seed metal layer away from the substrate and covering the seed metal layer.

5. The semiconductor layer according to claim 4, wherein the seed metal layer contains at least one of Ti, Ni, W, Pt and Au.

6. The semiconductor according to claim 4, wherein the back-metal metal layer contains at least one of Au, Ti and Au—Sn alloy.

7. The semiconductor chip according to claim 4, wherein the back-metal metal layer has a thickness between 2 μm and 10 μm.

8. The semiconductor chip according to claim 1, wherein the metal in a middle portion of the multi-portion structure has a thermal expansion coefficient less than that of the metal on the two sides of the multi-portion structure; a portion in the middle of the conductive material has a thickness being 2 to 10 folds of that of a portion on the two sides of the conductive material.

9. The semiconductor chip according to claim 1, wherein the multi-portion structure is a multilayer structure in a direction from an inside wall of the via hole to an axis of the via hole.

10. The semiconductor chip according to claim 1, wherein a portion, which contacts with the source electrode, in the multi-portion structure is made of the same metal as the source electrode.

11. The semiconductor chip according to claim 1, wherein the multi-portion structure is a multilayer structure in a direction of the axis of the via hole.

12. The semiconductor chip according to claim 1, wherein the metal in a middle portion of the multi-portion structure has a thermal expansion coefficient less than that of the metal on the two sides thereof.

13. A semiconductor wafer, comprising:
a substrate having a substrate sheet and an epitaxial layer grown on the substrate sheet, the epitaxial layer being made of a semiconductor material;
a plurality of devices provided on a side of the substrate;
a plurality of via holes, located in the substrate, running through the substrate and corresponding to the plurality of devices;
a conductive material, an entirety of the conductive material being filled in the plurality of via holes and contacted with the plurality of devices; and
a backside metal layer provided on the other side of the substrate away from the devices, the backside metal layer coming into contact with the conductive material so as to be electrically connected to the plurality of devices respectively via the conductive material,
wherein the conductive material comprises a multi-portion structure having three or more portions, each portion being made of one or more kinds of metal, the conductive material is embedded in the semiconductor material of the epitaxial layer, the multi-portion structure is formed by stacking one portion on another in an axial direction of the plurality of via holes, each portion of the multi-portion structure contacts a side wall of the plurality of via holes, and the conductive material contacts both of the substrate sheet and the epitaxial layer;
wherein each of the plurality of the devices comprises a source electrode made of metal, the conductive material directly contacts with the source electrode; and
a portion of the backside metal layer in contact with the conductive material extends to inside of the plurality of via holes, so that the side wall of each of the plurality of via holes contacts the conductive material and the backside metal layer, the conductive material cover a part of the side wall, and the backside metal layer cover other part of the side wall.

14. The semiconductor wafer according to claim 13, wherein the amount of the conductive material filled in the plurality of via holes is 50% to 98% of the volume of the plurality of via holes.

15. The semiconductor wafer according to claim 13, wherein the backside metal layer comprises a back-metal metal layer and a seed metal layer, the seed metal layer being located on a side of the substrate away from the devices and covering the plurality of via holes, the back-metal metal layer being located on a side of the seed metal layer away from the substrate and covering the seed metal layer.

16. The semiconductor wafer according to claim 14, wherein each of the plurality of devices further comprises a gate electrode and a drain electrode.

17. A method for manufacturing a semiconductor wafer, comprising:
providing a substrate having a substrate sheet and an epitaxial layer grown on the substrate sheet, the epitaxial layer being made of a semiconductor material;
forming a plurality of devices on a side of the substrate;
forming, in the substrate and from a side of the substrate away from the plurality of devices and corresponding to the plurality of devices, a plurality of via holes running through the substrate;
filling conductive material in the plurality of via holes respectively, so that the conductive material contacts with the plurality of devices respectively and an entirety of the conductive material is filled in the plurality of via holes;
forming a backside metal layer on a side of the substrate away from the plurality of devices, so that the backside metal layer contacts with the conductive material is electrically connected to the plurality of devices via the conductive material,
wherein the conductive material comprises a multi-portion structure having three or more portions, each portion being made of one or more kinds of metal, the conductive material is embedded in the semiconductor material of the epitaxial layer, the multi-portion structure is formed by stacking one portion on another in an axial direction of the plurality of via holes, each portion of the multi-portion structure contacts a side wall of the plurality of via holes, and the conductive material contacts both of the substrate sheet and the epitaxial layer;
wherein each of the plurality of devices comprises a source electrode made of metal, the conductive material directly contacts with the source electrode; and
a portion of the backside metal layer in contact with the conductive material extends to inside of the plurality of via holes, so that a side wall of each of the plurality of via holes contacts the conductive material and the backside metal layer, the conductive material cover a part of the side wall, and the backside metal layer cover other part of the side wall.

18. The method for manufacturing a semiconductor wafer according to claim 17, wherein the amount of the conductive material filled in the plurality of via holes is 50% to 98% of the volume of the plurality of via holes.

19. The method for manufacturing a semiconductor wafer according to claim 17, wherein forming the backside metal layer on the side of the substrate away from the devices comprises: forming a seed metal layer on the side of the substrate away from the devices, the seed metal layer covering the plurality of via holes; and forming a back-metal metal layer on a side of the seed metal layer away from the substrate, the back-metal metal layer covering the seed metal layer.

* * * * *